(12) United States Patent
Hong (10) Patent No.: US 6,927,722 B2
(45) Date of Patent: Aug. 9, 2005

(54) SERIES CAPACITIVE COMPONENT FOR SWITCHED-CAPACITOR CIRCUITS CONSISTING OF SERIES-CONNECTED CAPACITORS

(75) Inventor: Merit Hong, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 78 days.

(21) Appl. No.: 10/441,348

(22) Filed: May 20, 2003

(65) Prior Publication Data

US 2004/0233092 A1 Nov. 25, 2004

(51) Int. Cl.$^7$ .............................................. H03M 3/00
(52) U.S. Cl. ..................... 341/172; 341/143; 333/173
(58) Field of Search .................. 341/143; 333/173; 361/328, 329, 330

(56) References Cited

U.S. PATENT DOCUMENTS

| | | | |
|---|---|---|---|
| 4,419,713 A | * 12/1983 | Levinson | 361/321.2 |
| 4,543,546 A | * 9/1985 | Hariharan | 333/173 |
| 5,182,521 A | * 1/1993 | Chang et al. | 327/553 |
| 5,892,472 A | * 4/1999 | Shu et al. | 341/139 |
| 6,147,551 A | 11/2000 | Hong | |

OTHER PUBLICATIONS

Sauerbrey et al.; A 0.7–V MOSFET–Only Switched–Opamp Sigma–Delta Modulator in Standard Digital CMOS Technology, IEEE Journal of Solid–State Circuits, vol. 37 No. 12, Dec. 2002, pp. 1662–1669.*

Hayt, Jr. et al., Engineering Circuit Analysis, 1978, Mc–Graw Hill, p. 155.*

Hong, Merit, "The Reduction of Sampling Noise in Switched–Capacitor Circuits through Spatial Oversampling," IEEE International Symposium on Circuits and Systems 2002, Scottsdale, AZ, 5 pp.

* cited by examiner

Primary Examiner—Howard L. Williams
(74) Attorney, Agent, or Firm—Toler, Larson & Abel, LLP (57) ABSTRACT

A series capacitive component for use in signal processing applications such as analog-to-digital (A/D) converters, switched capacitor circuits and the like that require matched capacitors is presented. A series capacitive component consists of multiple capacitors connected in series. By utilizing series capacitive components in integrated circuits, significantly lower loads are provided for the same resulting capacitor mismatch range as previous solutions. Additionally, for the same load and noise, using series capacitive components provides a substantially reduced match over previous solutions. Thus a circuit designer has more flexibility when making tradeoffs between circuit area and capacitor mismatch and therefore manufacturing yields.

31 Claims, 4 Drawing Sheets

| | NOMINAL CAPACITOR | SERIES CAPACITIVE COMPONENT | PRIOR ART SOLUTION |
|---|---|---|---|
| CONFIGURATION | C | n x nC IN SERIES | $n^2$ x C IN PARALLEL, OR SINGLE $n^2$C |
| MISMATCH | $\frac{\delta C}{C}$ | $\frac{1}{n}\frac{\delta C}{C}$ | $\frac{1}{n}\frac{\delta C}{C}$ |
| NOISE | $\frac{kT}{C}$ | $\frac{kT}{C}$ | $\frac{kT}{n^2 C}$ |
| LOAD | C | C | $n^2$C |

FIG.5B

|  | PRIOR ART SOLUTION | SERIES CAPACITIVE COMPONENT | REQUIREMENT |
|---|---|---|---|
| UNIT CAP | C = 10 pF | C = 7 pF |  |
| NUMBER | n = 1 | n = 2 |  |
| MISMATCH | $\frac{\delta 10\ pF}{10\ pF}$ | $\frac{1}{\sqrt{2}}\frac{\delta 7\ pF}{7\ pF} \approx 0.85\frac{\delta 10\ pF}{10\ pF}$ | $\leq \frac{\delta 10\ pF}{10\ pF}$ |
| NOISE | $\frac{kT}{10\ pF}$ | $\frac{kT}{3.5\ pF}$ | $\leq \frac{kT}{3.5\ pF}$ |
| LOAD | 10 pF | 3.5 pF |  |

SERIES CAPACITIVE COMPONENT FOR SWITCHED-CAPACITOR CIRCUITS CONSISTING OF SERIES-CONNECTED CAPACITORS

BACKGROUND

1. Field of the Disclosure

The present disclosure relates to the field of integrated circuits, and more particularly to the use of capacitors in signal processing applications.

2. Description of the Related Art

Capacitors are widely used in signal processing applications such as, for example, filtering, analog to digital converting, digital to analog converting, and the like. Often, multiple capacitors are used that need to have accurate capacitance values and/or ratios, for example, in switched capacitor circuits. Variations in semiconductor processing lead to capacitor mismatch, which can be a limiting factor in many circuits, for example, such as cyclic/pipelined analog to digital converters. The amount of capacitance that each of the multiple capacitors can vary from each other and have the circuit operate properly is referred to as a capacitor mismatch range and is based upon desired performance levels.

Smaller capacitors that meet the desired capacitor mismatch range are difficult to manufacture in semiconductor processes. A designer often increases the area of each capacitor, maintaining a similar ratio between the capacitors, to improve the manufacturability of the circuit. Increasing the area of multiple capacitors uses valuable circuit area, therefore increasing the cost of the integrated circuit. Additionally, increasing the area of a capacitor increases the load, therefore decreasing the power efficiency of the circuit. A tradeoff is often made between the size of the capacitors and the capacitor mismatch, affecting semiconductor yield.

A designer can also utilize multiple capacitors in parallel to reduce capacitor mismatch. For example, to achieve a 1:3 ratio, four similar sized or unit element capacitors can be used, one alone and three in parallel. Capacitors in parallel have less mismatch because the errors tend to cancel. Suppose two unit capacitors of nominal value, for example, 1 picoFarad (pF) are used to construct a 2 pF overall capacitive load. Let the mismatch of the capacitance be the ratio of the actual capacitance to the nominal or ideal capacitance. Assume the probability distribution of available capacitors is as shown:

| Capacitance (pF) | Probability of selection | Mismatch |
| --- | --- | --- |
| 0.9 | $1/4$ | -10% |
| 1.0 | $1/2$ | 0% |
| 1.1 | $1/4$ | +10% |

Thus, the probability of plus or minus 10% mismatch is $1/4+1/4=1/2$. Mismatch can be improved by combining two capacitors in parallel. The probability distribution for two such connected capacitors is

| Capacitance Combination (pF) | Probability of Selection | Mismatch |
| --- | --- | --- |
| 0.9 + 0.9 | $1/4 \times 1/4 = 1/16$ | -10% |
| 0.9 + 1.0 | $1/4 \times 1/2 = 1/8$ | -5% |
| 0.9 + 1.1 | $1/4 \times 1/4 = 1/16$ | 0% |
| 1.0 + 0.9 | $1/2 \times 1/4 = 1/8$ | -5% |
| 1.0 + 1.0 | $1/2 \times 1/2 = 1/4$ | 0% |
| 1.0 + 1.1 | $1/2 \times 1/4 = 1/8$ | +5% |
| 1.1 + 0.9 | $1/4 \times 1/4 = 1/16$ | 0% |
| 1.1 + 1.0 | $1/4 \times 1/2 = 1/8$ | +5% |
| 1.1 + 1.1 | $1/4 \times 1/4 = 1/16$ | +10% |

With two capacitors, the probability of plus or minus 10% mismatch is $1/16+1/16=1/8$, which is a reduction from using a single capacitor. However, two capacitors in parallel consume proportionately more power to drive the larger capacitive load.

Researchers have proposed active capacitor mismatch reduction utilizing additional analog processing per stage. However, more analog processing entails the use of larger capacitors to compensate for the added kT/C noise (and hence more load capacitance), and the need for additional clock phases in a clock cycle (and thus require more settling). Also, higher operational amplifier gains are required to reduce the added integrator leakage from increased analog processing.

Accordingly, it would be advantageous to have a technique for providing circuits with matched capacitances, without significantly increasing circuit area or load and improving semiconductor yield.

BRIEF DESCRIPTION OF THE DRAWINGS

The present disclosure may be better understood, and its numerous features and advantages made apparent to those skilled in the art by referencing the accompanying drawings.

The use of the same reference symbols in different drawings indicates similar or identical items.

DESCRIPTION OF THE PREFERRED EMBODIMENT(S)

Generally, the present disclosure provides a technique to reduce capacitor mismatch between multiple capacitive loads while simultaneously reducing capacitive load in circuits that require capacitor matching by utilizing series capacitive components having a different internal structure than capacitive unit elements. Each series capacitive component consists of multiple capacitors connected in series.

In the prior art, a capacitive unit element is comprised of a single capacitor whose area, and hence its capacitance, is increased in order to reduce mismatch. However, operating with increased capacitance, or capacitive load, requires increased power, which is generally undesirable. The series capacitive component according to an embodiment of the present disclosure achieves a smaller capacitance with similar mismatch.

The accuracy or resolution of many switched capacitor circuits is determined by switching (that is, kT/C) noise and mismatch requirements, and such accuracy or resolution is often limited solely by the mismatch. When limited by mismatch, the increased capacitance needed to meet the mismatch requirements is often far in excess of the capacitance needed to meet the switching noise requirement. A series capacitive component according to an embodiment of the present disclosure provides a means for trading off this excess margin in switching noise for reduced capacitive load while still meeting mismatch requirements, an option lacking in the prior art and one which creates new flexibility for the designer.

Figure 1:
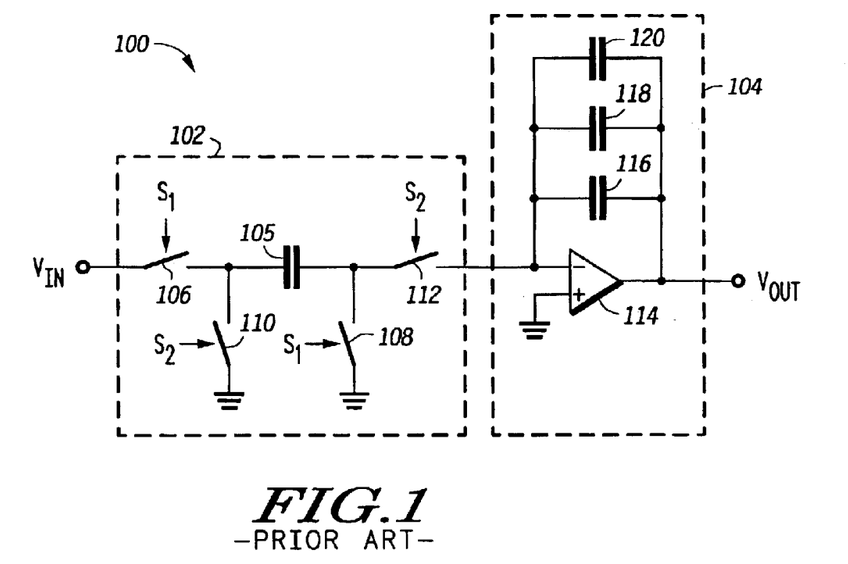
FIG. 1, labeled prior art, illustrates an exemplary integrator circuit.

FIG. 1 is a schematic drawing of an exemplary switched capacitance integrator circuit 100. Integrator circuit 100 is coupled for receiving an input signal at an input terminal $V_{in}$ and coupled for transmitting an output signal at an output terminal $V_{out}$. Internally, integrator circuit 100 includes a sampler 102 and an integrator 104.

Sampler 102 includes sampling capacitor 105. Sampler 102 also includes switches 106, 108, 110 and 112 each having a control electrode and two current conducting electrodes. Devices that can be used as switches 106, 108, 110 and 112 in sampler 102 include, for example, insulated gate field effect transistors (IGFETs), metal semiconductor field effect transistors (MESFETs), bipolar transistors, insulated gate bipolar transistors, and the like. It should be noted that switches 106, 108, 110 and 112 can be comprised of a single type of device, e.g., n-channel IGFETs, or a combination of several types of devices. When using a field effect transistor (FET) as a switch, those skilled in the art are aware that a gate electrode of the FET functions as the control electrode of the switch, and source and drain electrodes of the FET function as the current conducting electrodes of the switch. When using bipolar transistor as a switch, those skilled in the art are aware that a base electrode of the bipolar transistor functions as the control electrode of the switch, and emitter and collector electrodes of the bipolar transistor function as the current conducting electrodes of the switch.

A first electrode of capacitor 105 is coupled to a reference voltage, for example, ground, via switch 110 or coupled to input terminal $V_{in}$ via switch 106. A second electrode of capacitor 105 is coupled for transmitting a sampled signal of sampler 102 via switch 112 or coupled to ground via switch 108. The control electrodes of switches 106 and 108 are coupled for receiving a first clock signal S1. The control electrodes of switches 110 and 112 are coupled for receiving a second clock signal S2.

As described hereinafter, switches 106 and 108 are conductive during a sampling phase. Therefore, the first clock signal S1 applied to the control electrodes thereof is also referred to as a sampling signal. On the other hand, switches 110 and 112 are conductive during an integrating phase. Therefore, the second clock signal S2 applied to the control electrodes thereof is also referred to as an integrating signal. It should be noted that sampling signal S1 can be a voltage signal, a current signal, or the like, depending on what types of devices switches 106 and 108 are. Likewise, integrating signal S2 can be a voltage signal, a current signal, etc., depending on what types of devices switches 110 and 112 are.

Integrator 104 includes an operational amplifier 114 and multiple integrating capacitors 116, 118, and 120. Capacitors 105, 116, 118 and 120 are substantially equal to each other. Operational amplifier 114 has a non-inverting input connected to ground, and an inverting input coupled to the second electrode of capacitor 105 via switch 112 for receiving the sampled signal of sampler 102. The ground reference voltage connected to operational amplifier 114 can be equal to or different from the reference voltage connected to switches 108 and 110. An output of operational amplifier 114 is connected to output terminal $V_{out}$ of integrator circuit 100. Capacitors 116, 118 and 120 are connected in parallel and are coupled between the inverting input and the output of operational amplifier 114.

In operation, integrator circuit 100 samples the input signal at input terminal $V_{in}$, integrates the input signal, and transmits the integrated signal to output terminal $V_{out}$. In a clock cycle, sampling capacitor 105 samples the input signal during the sampling phase. The sampled signal is transferred to integrator 104 during the integrating phase following the sampling phase. During the sampling phase, capacitor 105 in integrator circuit 100 samples the input signal once. Switches 106 and 108 are conductive during the sampling phase and nonconductive during the integrating phase. Therefore, they are also referred to as sampling switches. On the other hand, switches 110 and 112 are nonconductive during the sampling phase and conductive during the integrating phase. Therefore, they are referred to as integrating switches.

In an integrator circuit such as integrator circuit 100, the ratio between the sampling capacitor and the integrating capacitor(s) is important. Capacitor mismatch is a growing problem with higher performance circuits. The capacitance of a capacitor having length L and width W is equal to ((L*W)*(capacitance per unit area)+2*(L+W)*(capacitance per unit periphery)+4*(capacitance per corner)). In practice, it is difficult to produce two capacitors with exactly a 1:N ratio in capacitance. As illustrated in FIG. 1, N+1 capacitors of substantially the same size can be used; one capacitor is the sampling capacitor and N capacitors, arranged in parallel, are the integrating capacitors. Integrator circuit 100 has a C:3C ratio, where C is the capacitance of each of the substantially similar capacitors 105, 116, 118 and 120. In this manner, all three of the contributions to a capacitor's capacitance via area capacitance, peripheral capacitance, and corner capacitance satisfy the same 1:3 ratio. Improving the accuracy of the ratio then becomes a matter of improving the matching between unit capacitive elements. The prior art approach is to increase unit capacitor size, which then increases load.

In another solution, because large capacitors are easier to fabricate accurately, the size of the sampling capacitor and the integrating capacitor can be increased to improve accuracy and manufacturing yields. However, increasing the size of capacitors disadvantageously increases the load of the circuit, therefore decreasing the power efficiency of the circuit.

Figure 2:
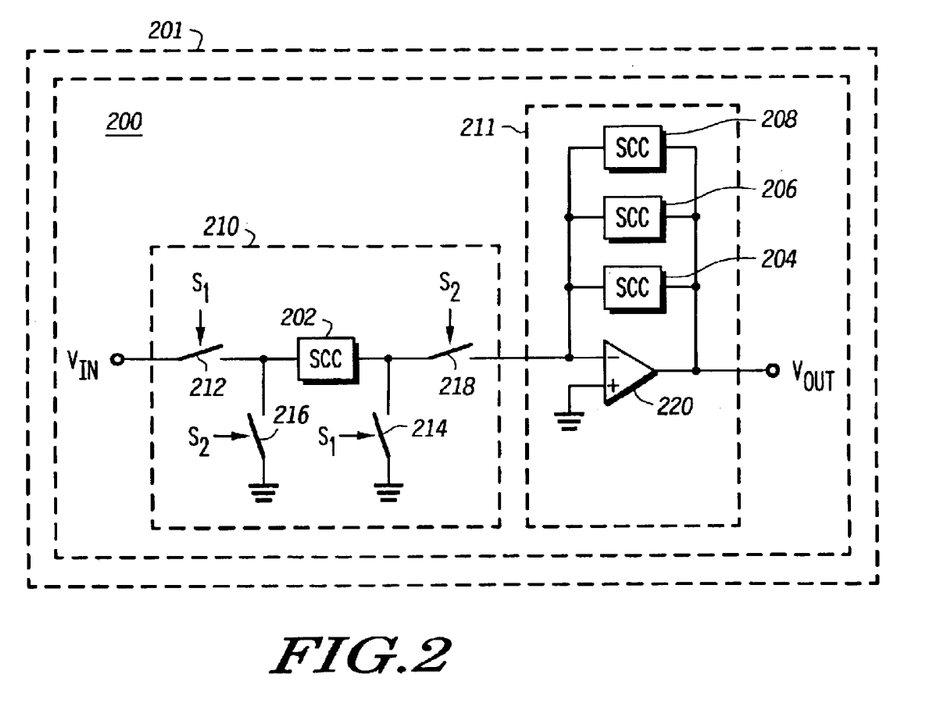
FIG. 2 illustrates an integrator circuit according to an embodiment of the present disclosure.

FIG. 2 is a schematic diagram illustrating a switched capacitance integrator circuit 200 according to an embodiment of the present disclosure. Switched capacitance integrator circuit 200 is a building block in circuit 201. Circuit 201 can be, for example, coupled with a comparator (not shown) forming an analog-to-digital (A/D) converter. Alternatively, circuit 201 can be a filter, a gain stage filter, a switched capacitor circuit or the like.

Integrator circuit 200 has a similar structure and operation as integrator circuit 100, however, capacitors 105, 116, 118, and 120 are replaced with series capacitive components 202, 204, 206, and 208 respectively. Integrator circuit 200 includes a sampler 210 and an integrator 211. Switches 212, 214, 216, and 218 are similar to and perform the same function as switches 106, 108, 110, and 112, respectively. Operational amplifier 220 is similar to and performs the same function as operational amplifier 114.

According to an embodiment of the present disclosure, series capacitive components 202, 204, 206 and 208 are substantially equal to each other and provide capacitances within a desired capacitor mismatch range. Each of series capacitive components 202, 204, 206 and 208 consist of multiple capacitors connected in series, providing greater accuracy in capacitance value, reduced capacitor mismatch, and improved circuit performance and manufacturing yield.

Note that the structure of integrator circuit 200 includes series capacitive components 204, 206, and 208 in parallel. If the variability in capacitance of each series capacitive component is reduced by the present disclosure, then not only will the parallel connection of series capacitive components have less variability, but most importantly the overall integration ratio will also have less variability. Thus, integrator circuit 200 improves capacitor mismatch both by using series capacitive components and by connecting them in parallel.

It should be understood that the structure of integrator circuit 200 is not limited to that shown in FIG. 2. For example, in an alternative embodiment, integrator circuit 200 can be coupled for receiving a differential input signal. In such an embodiment, instead of being coupled to ground, the second electrode of series capacitive component 202 is coupled for receiving one component of the differential input signal via switch 214. The other component of the differential input signal is applied to input terminal $V_{in}$. In another alternative embodiment, the second electrode of series capacitive component 202 is coupled via switch 214 for receiving a feedback signal generated by a feedback circuit (not shown) coupled to the output of integrator 211. Further, integrator circuit 200 is not limited to having three integrating series capacitive components, i.e., series capacitive components 204, 206, and 208. For example, integrator circuit 200 can have any plural number, e.g., two, four, five, six, etc., of integrating series capacitive components coupled to each other in parallel. Additionally, integrator circuit 200 can have a second or multiple sampler 210 circuits connected in parallel, wherein the capacitive load of the second sampler 210 circuit can be the same or different than the capacitive load of the first sampler 210 circuit.

Figure 3:
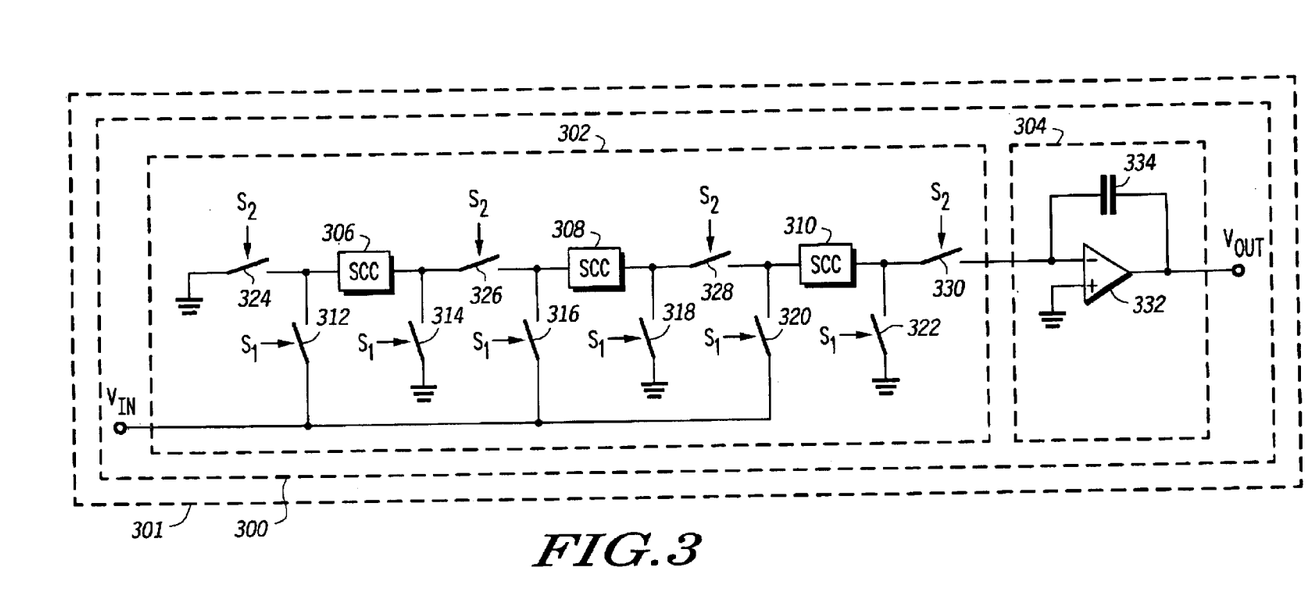
FIG. 3 illustrates a switched capacitor circuit according to an embodiment of the present disclosure.

Other circuit configurations can require capacitor matching and can benefit from the use of series capacitive components. For example, FIG. 3 illustrates an exemplary sampling network 300 according to an embodiment of the present disclosure. Sampling network 300 is a building block in circuit 301. Circuit 301 can be, for example, coupled with a comparator (not shown) forming an analog-to-digital (A/D) converter. Alternatively, circuit 301 can be a filter, a gain stage filter, a switched capacitor circuit or the like. Sampling network 300 is coupled for receiving an input signal at an input terminal $V_{in}$, and coupled for transmitting an output signal at an output terminal $V_{out}$. Internally, sampling network 300 includes a sampler 302 and an integrator 304.

Sampler 302 includes sampling series capacitive components 306, 308, and 310. For proper operation, the capacitance values of series capacitive components 306, 308, and 310 are substantially equal to each other. Sampler 302 also includes switches 312, 314, 316, 318, 320, 322, 324, 326, 328, and 330 each having a control electrode and two current conducting electrodes.

A first electrode of series capacitive component 306 is coupled to a reference voltage, for example, ground, via switch 324 or to input terminal $V_{in}$ via switch 312. A second electrode of series capacitive component 306 is coupled to a first electrode of series capacitive component 308 via switch 326 or to ground via switch 314. The first electrode of series capacitive component 308 is also coupled to input terminal $V_{in}$ via switch 316. A second electrode of series capacitive component 308 is coupled to a first electrode of series capacitive component 310 via switch 328 or to ground via switch 318. The first electrode of series capacitive component 310 is also coupled to input terminal $V_{in}$ via switch 320. A second electrode of series capacitive component 310 is coupled for transmitting a sampled signal of sampler 302 via switch 330 or to ground via switch 322. The control electrodes of switches 312, 314, 316, 318, 320 and 322 are coupled for receiving a first clock signal S1. The control electrodes of switches 324, 326, 328, and 330 are coupled for receiving a second clock signal S2.

As described hereinafter, switches 312, 314, 316, 318, 320 and 322 are conductive during a sampling phase. Therefore, the first clock signal S1 applied to the control electrodes thereof is also referred to as a sampling signal. On the other hand, switches 324, 326, 328 and 330 are conductive during an integrating phase. Therefore, the second clock signal S2 applied to the control electrodes thereof is also referred to as an integrating signal.

Integrator 304 includes an operational amplifier 332 and an integrating capacitor 334. Operational amplifier 332 has a non-inverting input connected to ground, and an inverting input coupled to the second electrode of capacitor 310 via switch 330 for receiving the sampled signal of sampler 302. The ground reference voltage connected to operational amplifier 332 can be equal to or different from the reference voltage connected to switches 314, 318, 322, and 324. An output of operational amplifier 332 is connected to output terminal $V_{out}$ of sampling network 300. Capacitor 334 is coupled between the inverting input and the output of operational amplifier 332. In an alternative embodiment, capacitor 334 can be a series capacitive component having a size proportional to the size of series capacitive components 306, 308 and 310.

In operation, sampling network 300 samples the input signal at input terminal $V_{in}$, integrates the input signal, and transmits the integrated signal to output terminal $V_{out}$. In a clock cycle, each of sampling series capacitive components 306, 308, and 310 samples the input signal during the sampling phase. The sampled signal is transferred to integrator 304 during the integrating phase following the sampling phase. During the sampling phase, each of series capacitive components 306, 308, and 310 in sampling network 300 samples the input signal once. Thus, sampling network 300 performs a 3× over-sampling and improves the signal to noise ratio substantially by a factor of three. Switches 312, 314, 316, 318 and 322 are conductive during the sampling phase and nonconductive during the integrating phase. Therefore, they are also referred to as sampling switches. On the other hand, switches 324, 326, 328 and 330 are nonconductive during the sampling phase and conductive during the integrating phase. Therefore, they are also referred to as integrating switches. Switches 324, 326, 328 and 330 are serially coupled with series capacitive components 306, 308, and 310 to form an arrangement or a pattern of alternating integrating switches and sampling series capacitive components. Switches 324 and 330 are located at two endpoints of the arrangement and, therefore, are also referred to as endpoint switches.

It should be understood that the structure of sampling network 300 is not limited to being that shown in FIG. 3. For example, sampling network 300 is not limited to having three sampling series capacitive components, i.e., series capacitive components 306, 308, and 310. Sampling network 300 can have any plural number, e.g., two, four, five, six, etc., of sampling series capacitive components coupled to each other via switches. Generally, the sampling rate of sampling network 300 is equal to the number of sampling series capacitive components therein. Additionally, sampling network 300 can have a second or multiple sampler 302 circuits connected in parallel, wherein the capacitive load of the second sampler 302 circuit can be the same or different than the capacitive load of the first sampler 302 circuit.

Figure 4A:
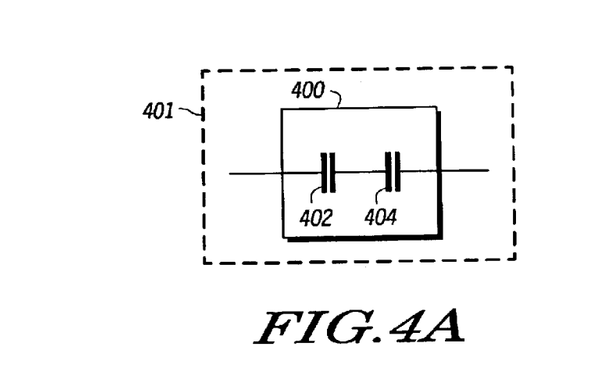
FIGS. 4A–4B illustrate exemplary series capacitive components implemented in integrated circuits according to embodiments of the present disclosure.

FIG. 4A is a schematic diagram of a series capacitive component 400 implemented in an integrated circuit 401 according to an embodiment of the present disclosure. Capacitors 402 and 404 are connected in series without any intervening connections other than the connection between capacitors 402 and 404, such as connections to other circuitry, to a reference voltage and the like. Capacitors 402 and 404 are substantially the same size providing substantially similar capacitances.

Figure 4B:
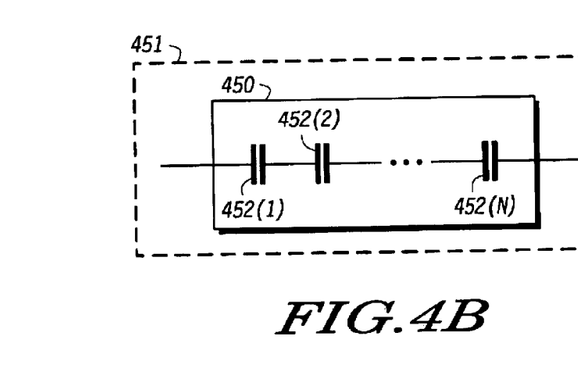

FIG. 4B is a schematic diagram of another exemplary series capacitive component 450 implemented in an integrated circuit 451 according to an embodiment of the present disclosure. Capacitors 452(1)–452(N) are connected in series without any intervening connections other than the connections between capacitors 452, such as connections to other circuitry, to a reference voltage and the like. N can be any number greater than one, for example, three, five, six, or the like. Capacitors 451(1)–452(N) are substantially the same size providing substantially similar capacitances.

In an alternate embodiment of the present invention, each of capacitors 402 and 404 and each of capacitors 452 consist of multiple capacitors connected in parallel.

According to an embodiment of the present disclosure, series capacitive components 400 and 450 are part of application specific circuits, for example, A/D converters, switched capacitive units, integrators, and the like. Such application specific circuits are typically part of a commercialized function and are not simply implemented to perform a test function, such as the testing of a semiconductor process.

According to an embodiment of the present disclosure, substantially similar capacitances are not necessarily identical as a result of manufacturing process variations. According to another embodiment, substantially similar capacitances can vary up to 10%. According to another embodiment, substantially similar capacitances can vary no more than 2%.

According to another embodiment of the present disclosure, if two capacitors differ by plus or minus 25%, that is, one capacitor is 25% larger than nominal and the other capacitor is 25% smaller than nominal, then there is no benefit to the series construction. Ideally, capacitors within plus or minus 25% of nominal would be considered substantially similar. How the benefits degrade with capacitor difference is shown below.

| Capacitor Difference | Mismatch Reduction |
|---|---|
| 0% | 29% |
| ±5% | 28% |
| ±10% | 25% |
| ±15% | 19% |
| ±20% | 11% |
| ±25% | 0% |

Figure 5A:
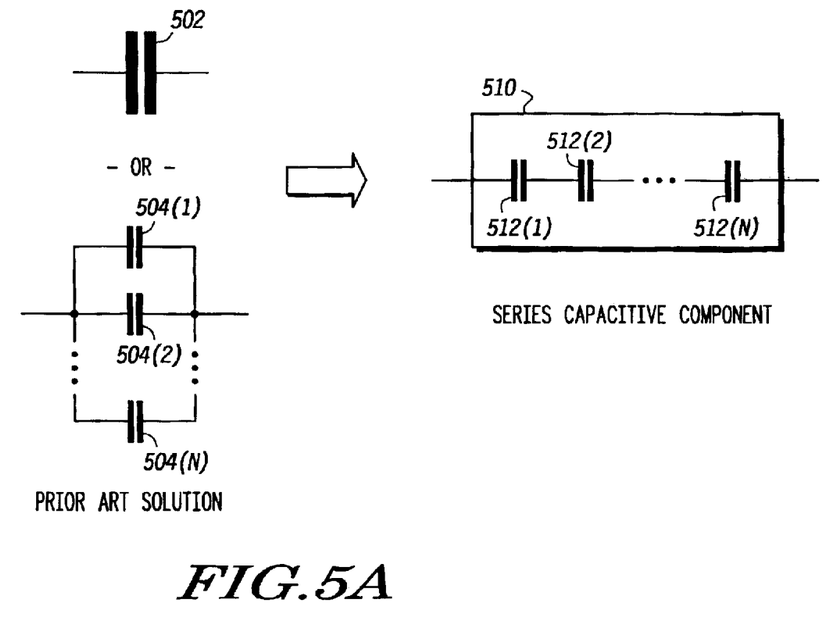
FIGS. 5A–5D illustrates comparisons of prior art methods and the use of series capacitive components according to an embodiment of the present disclosure.

FIGS. 5A–5D illustrate the advantages of the use of series capacitive components over prior art methods for reducing capacitor mismatch. As illustrated in FIG. 5A, prior art solutions included utilizing a large capacitor 502 or multiple capacitors 504(1)–504(N) connected in parallel. In the current solution, a series capacitive component 510 utilizes multiple capacitors 512(1)–512(N) connected in series, wherein N is two or more.

Figure 5B:
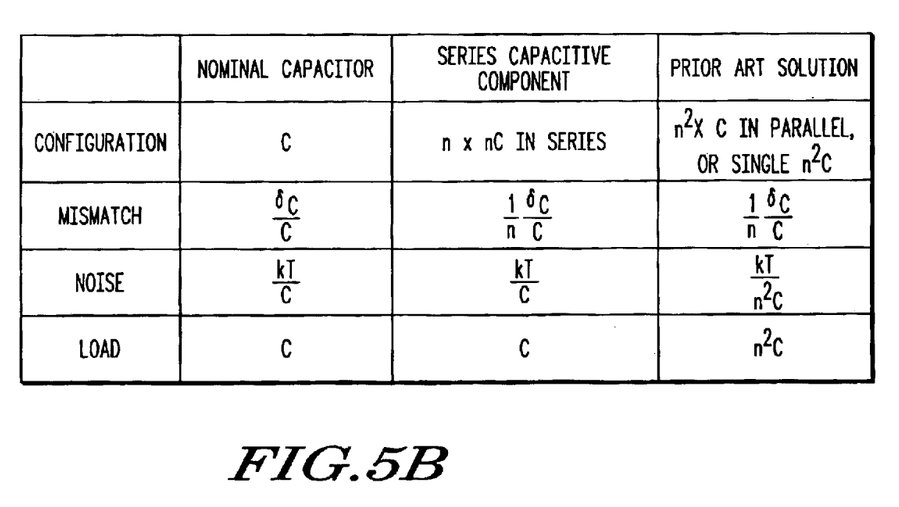

FIG. 5B illustrates a table comparing mismatch, noise and load results for a prior art solution to the results of using a series capacitive component according to an embodiment of the present disclosure. With a single unit capacitor of capacitance C shown in the first column, a mismatch of $\sigma_C/C$ is obtained along with a noise of kT/C and a load of C. For the same load (C) and noise (kT/C), the series capacitive component provides substantially reduced mismatch (1/N times $\sigma_C/C$) over the single unit capacitor ($\sigma_C/C$). Lower capacitor mismatch results in higher yield for the semiconductor processing. Many switched capacitor circuits, such as analog to digital and digital to analog converters and filters rely on precision capacitor ratios for proper operation. Comparing the right two columns, for the same mismatch (1/N times $\sigma_C/C$), the series capacitive component provides substantially reduced load (C) over the prior art solution ($N^2C$). Thus, because of the reduction in load capacitance, higher performance and/or lower power is achieved.

Referring to FIG. 5B, suppose there are only capacitors with nominal value C available. Used by itself, a single capacitor has the characteristics given in the left column. Suppose it is desired to reduce the mismatch by n. Then one possible embodiment of the disclosure is to first construct n copies each of n capacitors connected in parallel. Each copy is a parallel connection of n capacitors with overall capacitance nC. These n copies are then connected in series. The characteristic is given in the middle column result. To achieve the same mismatch as the disclosure, prior art would connect all n×n of these individual capacitors in parallel. The resultant characteristics are given in the right column. Compared to prior art, the series capacitive component has a noise larger by a factor of $n^2$ and a load smaller by a factor of $n^2$. The use of series capacitive components is desirable when the load presents a stronger design constraint than the noise.

Figure 5C:
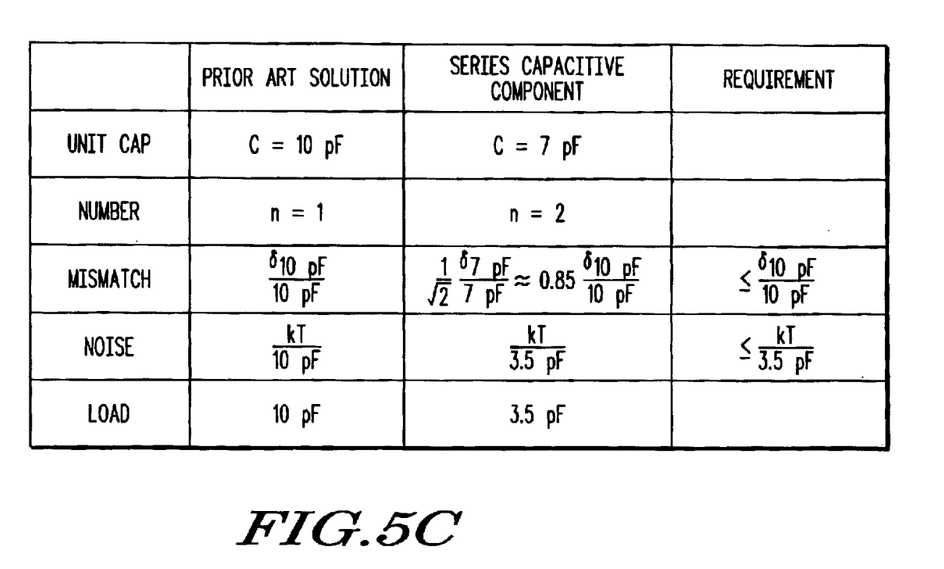

FIG. 5C compares the mismatch, noise and load results for a prior art solution to the results of using a series capacitive component according to an embodiment of the present disclosure for an exemplary circuit, for example, a 12-bit pipelined A/D converter where noise is restricted to less than kT/3.5 pF and the mismatch to better than $\sigma_{10pF}/10$ pF to achieve a 90% manufacturing yield. As illustrated, the result is a 3× reduction in load capacitance. Thus, the circuit can operate with 3×–9× less power or operate 3× faster.

Figure 5D:
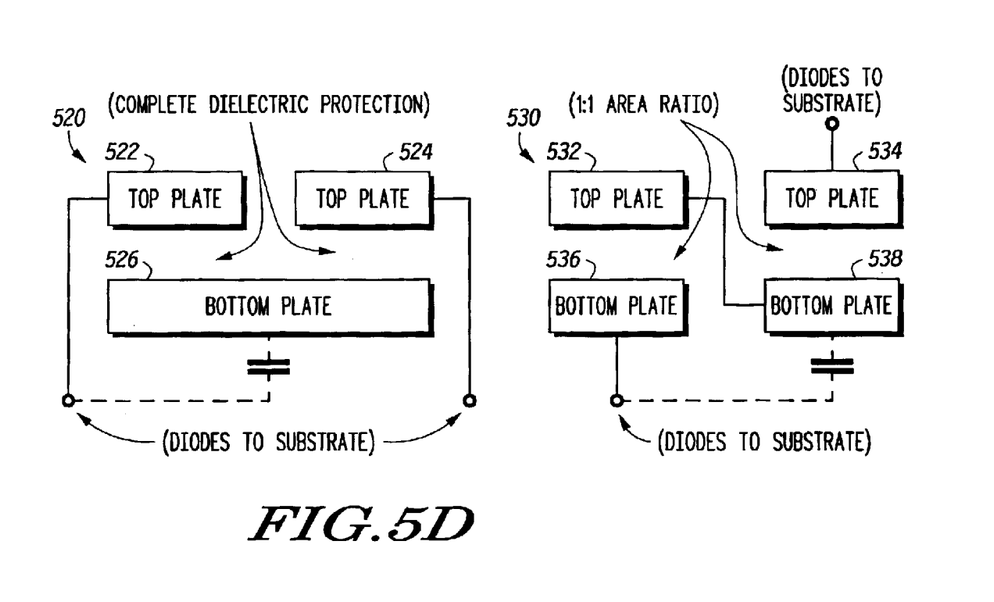

FIG. 5D illustrates two embodiments of the semiconductor fabrication of a series capacitive component having two capacitors connected in series according to an embodiment of the present disclosure. As illustrated, a series capacitive component 520 has two top plates 522 and 524 coupled to diodes to the substrate. Top plates 522 and 524 are at an upper level (semiconductor layer) above a single bottom plate 526 forming two capacitors connected in series. A series capacitive component 530 has two top plates 532 and 534 at an upper level above two bottom plates 536 and 538, respectively. Top plate 532 is coupled to bottom plate 538, and top plate 534 and bottom plate 536 are each coupled to a diode to the substrate, forming two capacitors connected in series.

According to an embodiment of the present disclosure, each of the multiple capacitors connected in series forming a series capacitive component is formed at least partially overlying a semiconductor substrate. The capacitors are deliberately formed devices, that is, not simply parasitic capacitances of the integrated circuit device.

When designing a circuit, for example, a switched capacitor circuit, a designer uses the smallest possible capacitance C determined from the kT/C noise requirements. For each integer value of N, the designer can consider a series of N capacitors, each capacitor with a value of NC. N is chosen to produce the desired capacitor mismatch.

Realizations in accordance with the present disclosure have been described in the context of particular embodiments. These embodiments are meant to be illustrative and not limiting. Many variations, modifications, additions, and improvements are possible. Accordingly plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the exemplary configurations may be implemented as a combined structure or component. These and other variations, modifications, additions, and improvements may fall within the scope of the disclosure as defined in the claims that follow.

What is claimed is:

1. An integrated circuit device comprising:
  an analog-to-digital (A/D) converter, the A/D converter comprising:
    a sampler comprising a first series capacitive component comprising a single input, a single output and a first plurality of capacitors connected in series between the single input and the single output; and
    an integrator coupled to the sampler and comprising a second series capacitive component comprising a single input, a single output and a second plurality of capacitors connected in series between the single input and the single output.

2. The integrated circuit device as recited in claim 1, wherein the first series capacitive component and the second series capacitive component have net capacitances within a desired capacitor mismatch range.

3. The integrated circuit device as recited in claim 1, wherein the first plurality of capacitors and the second plurality of capacitors have a same number of capacitors connected in series.

4. The integrated circuit device as recited in claim 3, the sampler further comprising a switch coupled to the first series capacitive component and the integrator further comprising an operational amplifier coupled to the second series capacitive component, wherein the first series capacitive component is a sampling series capacitive component and the second series capacitive component is an integrating series capacitive component.

5. The integrated circuit device as recited in claim 1, the A/D converter further comprising a switch coupled to a first node of the first series capacitive component wherein the first series capacitive component is a switched series capacitive component.

6. The integrated circuit device as recited in claim 1, wherein each of the first plurality of capacitors at least partially overlies a semiconductor substrate.

7. The integrated circuit device as recited in claim 1, wherein each one of the first plurality of capacitors has a substantially similar capacitance such that a net capacitance of the first series capacitive component is within a desired range.

8. An integrated circuit device comprising:
  a switched capacitor circuit, the switched capacitor circuit comprising:
    a first series capacitive component comprising a single input, a single output and a first plurality of capacitors connected in series between the single input and the single output; and
    a second series capacitive component comprising a single input, a single output and second plurality of capacitors connected in series between the single input and the single output.

9. The integrated circuit device as recited in claim 8, wherein the first series capacitive component and the second series capacitive component have net capacitances within a desired capacitor mismatch range.

10. The integrated circuit device as recited in claim 8, wherein the first plurality of capacitors and the second plurality of capacitors have a same number of capacitors connected in series.

11. The integrated circuit device as recited in claim 8, the switched capacitor circuit further comprising a switch coupled to the first series capacitive component and an operational amplifier coupled to the second series capacitive component, wherein the first series capacitive component is a sampling series capacitive component and the second series capacitive component is an integrating series capacitive component.

12. The integrated circuit device as recited in claim 8, the switched capacitor circuit further comprising a switch coupled to a first node of the first series capacitive component wherein the first series capacitive component is a switched series capacitive component.

13. The integrated circuit device as recited in claim 8, wherein each of the first plurality of capacitors at least partially overlies a semiconductor substrate.

14. The integrated circuit device as recited in claim 8, wherein each one of the first plurality of capacitors has a substantially similar capacitance such that a net capacitance of the first series capacitive component is within a desired range.

15. A method comprising:
  determining a plurality of series capacitive components each having a capacitance that is to be within a same desired capacitance range; and
  configuring each of the plurality of series capacitive components to comprise a single input, a single output and a plurality of capacitors connected in series between the single input and the single output.

16. The method as recited in claim 15, wherein at least one of the plurality of series capacitive components is a switched series capacitive component.

17. The method as recited in claim 15, wherein at least one of the plurality of series capacitive components is coupled to a sampling capacitor and an operational amplifier, wherein the at least one of the plurality of series capacitive components is an integrating series capacitive component.

18. A method comprising:
providing a plurality of matched series capacitive components to perform a specified function, wherein each of the plurality of series capacitive components comprise a single input, a single output and a plurality of capacitors connected in series between the single input and the single output.

19. The method as recited in claim 18, wherein the matched series capacitive components have capacitances within a desired capacitor mismatch range.

20. The method as recited in claim 18, wherein providing comprises:
designing a circuit to perform the specified function and recording the circuit in an electronic format.

21. The method as recited in claim 18, wherein providing comprises:
manufacturing an integrated circuit.

22. A method for reducing capacitor mismatch comprising:
determining a desired capacitive value;
determining a desired matching characteristic between a plurality of series capacitive components; and
defining each of the plurality of series capacitive components to consist of a plurality of capacitors based on the desired capacitive value and the desired matching characteristic.

23. The method as recited in claim 22, wherein defining comprises:
designing a circuit to perform a specified function and recording the circuit in an electronic format.

24. The method as recited in claim 22, wherein defining comprises:
manufacturing an integrated circuit.

25. An integrated circuit device comprising:
an analog-to-digital (A/D) converter; the A/D converter comprising:
a sampler comprising a first series capacitive component consisting of a first plurality of capacitive devices connected in series, wherein each of the first plurality of capacitive devices comprises a single input, a single output and a plurality of capacitors connected in parallel between the single input and the single output; and
an integrator coupled to the sampler and comprising a second series capacitive component comprises a single input, a single output, and a second plurality of capacitive devices connected in series between the single input and the single output.

26. The integrated circuit device as recited in claim 25, wherein the first series capacitive component and the second series capacitive component have net capacitances within a desired capacitor mismatch range.

27. The integrated circuit device as recited in claim 25, wherein the first plurality of capacitors and the second plurality of capacitors has a same number of capacitive devices connected in series.

28. The integrated circuit device as recited in claim 27, the sampler further comprising a switch coupled to the first series capacitive component and the integrator further comprising an operational amplifier coupled to the second series capacitive component, wherein the first series capacitive component is a sampling series capacitive component and the second series capacitive component is an integrating series capacitive component.

29. The integrated circuit device as recited in claim 25, the A/D converter further comprising a switch coupled to a first node of the first series capacitive component, wherein the series capacitive component is a switched series capacitive component.

30. The integrated circuit device as recited in claim 25, wherein each of the plurality of capacitors at least partially overlies a semiconductor substrate.

31. The integrated circuit device as recited in claim 25, wherein each one of the plurality of capacitors has a substantially similar capacitance such that a net capacitance of the first series capacitive component is within a desired range.

* * * * *